(12) United States Patent
Sohda et al.

(10) Patent No.: US 10,134,558 B2
(45) Date of Patent: Nov. 20, 2018

(54) SCANNING ELECTRON MICROSCOPE

(71) Applicant: Hitachi High-Technologies Corporation, Minato-ku, Tokyo (JP)

(72) Inventors: Yasunari Sohda, Tokyo (JP);
Takeyoshi Ohashi, Tokyo (JP);
Takafumi Miwa, Tokyo (JP);
Noritsugu Takahashi, Tokyo (JP);
Hajime Kawano, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/123,828

(22) PCT Filed: Feb. 4, 2015

(86) PCT No.: PCT/JP2015/053033
§ 371 (c)(1),
(2) Date: Sep. 6, 2016

(87) PCT Pub. No.: WO2015/133214
PCT Pub. Date: Sep. 11, 2015

(65) Prior Publication Data
US 2017/0018394 A1    Jan. 19, 2017

(30) Foreign Application Priority Data

Mar. 7, 2014  (JP) .................................. 2014-045311

(51) Int. Cl.
*H01J 37/05*        (2006.01)
*H01J 37/29*        (2006.01)
(Continued)

(52) U.S. Cl.
CPC .............. *H01J 37/05* (2013.01); *H01J 37/145* (2013.01); *H01J 37/21* (2013.01); *H01J 37/263* (2013.01);
(Continued)

(58) Field of Classification Search
None
See application file for complete search history.

(56) References Cited

U.S. PATENT DOCUMENTS 4,697,080 A * 9/1987 King .................. G01N 23/2251
250/307
4,937,458 A * 6/1990 Fujikura ................ B82Y 10/00
250/397

(Continued)

FOREIGN PATENT DOCUMENTS

JP    62-93848 A    4/1987
JP    62093848 A *  4/1987 .............. H01J 37/28
(Continued)

OTHER PUBLICATIONS

International Search Report (PCT/ISA/210) issued in PCT Application No. PCT/JP2051/053033 dated Apr. 7, 2015 with English-language translation (four (4) pages).
(Continued)

*Primary Examiner* — Michael Logie
(74) *Attorney, Agent, or Firm* — Crowell & Moring LLP

(57) ABSTRACT

A scanning electron microscope according to the present invention includes: an electron source that produces an electron beam; a trajectory dispersion unit that disperses the trajectory of an electron beam of electrons with a different energy value; a selection slit plate having a selection slit that selects the energy range of the dispersed electron beam; and a transmittance monitoring unit that monitors the transmittance of an electron beam, which is being transmitted through the selection slit. Accordingly, there can be provided a scanning electron microscope equipped with an energy filter that implements a stable reduction in energy distribution.

8 Claims, 12 Drawing Sheets

(51) Int. Cl.
*H01J 37/21* (2006.01)
*H01J 37/28* (2006.01)
*H01J 37/145* (2006.01)
*H01J 37/26* (2006.01)

(52) U.S. Cl.
CPC ............ H01J 37/28 (2013.01); H01J 37/292 (2013.01); *H01J 2237/057* (2013.01); *H01J 2237/1534* (2013.01); *H01J 2237/24514* (2013.01)

(56) References Cited

U.S. PATENT DOCUMENTS

| | | | | |
|---|---|---|---|---|
| 5,061,851 | A * | 10/1991 | Noguchi | H01J 37/04 250/396 R |
| 5,449,915 | A * | 9/1995 | Yamada | B82Y 10/00 219/121.23 |
| 5,731,580 | A * | 3/1998 | Sato | H01J 37/244 250/310 |
| 5,933,217 | A * | 8/1999 | Nakasuji | B82Y 10/00 250/492.2 |
| 5,969,355 | A * | 10/1999 | Fujii | H01J 37/304 250/309 |
| 6,184,524 | B1 * | 2/2001 | Brink | H01J 37/05 250/305 |
| 6,403,971 | B1 * | 6/2002 | Kawata | H01J 37/304 250/491.1 |
| 6,593,578 | B1 * | 7/2003 | Duval | H01J 37/05 250/396 ML |
| 6,614,026 | B1 * | 9/2003 | Adamec | H01J 37/1478 250/396 ML |
| 6,670,611 | B1 * | 12/2003 | Kruit | H01J 37/05 250/288 |
| 6,678,932 | B1 * | 1/2004 | Duval | H01J 37/05 269/16 |
| 6,933,512 | B2 * | 8/2005 | Matsuya | G01N 23/04 250/491.1 |
| 7,429,740 | B2 * | 9/2008 | Salvesen | H01J 37/1413 250/396 ML |
| 7,465,582 | B1 | 12/2008 | Arenas et al. | |
| 8,274,046 | B1 * | 9/2012 | Ren | H01J 37/05 250/305 |
| 2004/0029046 | A1 * | 2/2004 | Nagano | B82Y 10/00 430/296 |
| 2007/0069150 | A1 * | 3/2007 | Frosien | H01J 37/05 250/396 ML |
| 2007/0200069 | A1 | 8/2007 | Frosien et al. | |
| 2009/0084954 | A1 * | 4/2009 | Ezumi | G01N 23/2251 250/307 |
| 2011/0108736 | A1 * | 5/2011 | Preikszas | H01J 37/1478 250/397 |
| 2012/0032079 | A1 * | 2/2012 | Nakasuji | G01N 23/225 250/310 |
| 2013/0256530 | A1 * | 10/2013 | Jiang | H01J 37/05 250/307 |
| 2013/0327938 | A1 * | 12/2013 | Kohno | H01J 37/22 250/307 |
| 2015/0034836 | A1 * | 2/2015 | Sohda | G21K 1/093 250/398 |
| 2016/0071683 | A1 * | 3/2016 | Mukai | H01J 37/05 250/305 |
| 2016/0079030 | A1 * | 3/2016 | Mukai | H01J 37/05 250/305 |

FOREIGN PATENT DOCUMENTS

| | | |
|---|---|---|
| JP | 3-283247 A | 12/1991 |
| JP | 4-112439 A | 4/1992 |
| JP | 2001-15055 A | 1/2001 |
| JP | 2002-524818 A | 8/2002 |
| JP | 2005-294128 A | 10/2005 |
| JP | 2007-519179 A | 7/2007 |
| JP | 2011-129257 A | 6/2011 |
| JP | 2012-243763 A | 12/2012 |

OTHER PUBLICATIONS

Japanese-language Written Opinion (PCT/ISA/237) issued in PCT Application No. PCT/JP2051/053033 dated Apr. 7, 2015 (six (6) pages).

* cited by examiner

| | MODE | REFERENCE VALUE (RATE OF CHANGE IN TRANSMITTANCE) |
|---|---|---|
| 1 | HIGH RESOLUTION | SMALL |
| 2 | HIGH SPEED | HIGH |
| 3 | HIGH ELECTRIC CURRENT | MIDDLE |
| 4 | HIGH-DEPTH-OF-FOCUS | MIDDLE |

SCANNING ELECTRON MICROSCOPE

TECHNICAL FIELD

The present invention relates to an inspection measurement apparatus using an electron beam.

BACKGROUND ART

A scanning electron microscope (SEM) used for the observation, inspection, and measurement of a sample using an electron beam accelerates electrons emitted from an electron source, and focuses and applies the electrons on the sample surface using an electrostatic or magnetic lens. The electrons are referred to as primary electrons. The incident primary electrons cause secondary electrons to be emitted from the sample. In some cases, low-energy electrons are referred to as secondary electrons, and high-energy electrons are referred to as reflection electrons. The secondary electrons are detected while an electron beam is being deflected and scanned. Thus, scanned images of fine patterns on the sample and the composition distribution of the sample can be obtained. Electrons absorbed to the sample are detected, allowing absorption electric current images to be formed as well.

One of basic functions of the scanning electron microscope is the resolution of the electron beam. Various methods are attempted in order to improve the resolution of the electron beam. One of the methods is a technique that reduces the energy distribution of the electron beam using an energy filter. This is a technique in which energy distribution is reduced to decrease chromatic aberration, improving resolution. The energy filter has a trajectory dispersion unit that disperses the trajectory of an electron beam of electrons with a different energy value and a selection slit that selects the energy range of the dispersed electron beam, implementing a reduction in energy distribution. The energy filter is sorted into methods, such as an Ω-filter and a Wien-filter, depending on methods of dispersing the trajectory of electrons.

In order to correctly obtain the effect of the energy filter, it is necessary to apply an electron beam in a desired shape to a desired location on a slit. In order to achieve this, Japanese Unexamined Patent Application Publication (Translation of PCT Application) No. 2002-524818 (Patent Literature 1), for example, describes a method of measuring the intensity of an electron beam on a plate including a selection slit. Japanese Unexamined Patent Application Publication No. 2011-129257 (Patent Literature 2) describes a method in which an electric current (a slit current) carried through an energy selection slit is minimized, optimizing the position of an electron beam on the energy selection slit. Japanese Unexamined Patent Application Publication No. 2005-294128 (Patent Literature 3) discloses a mechanical slit moving mechanism for selecting a select.

CITATION LIST

Patent Literature

Patent Literature 1: Japanese Unexamined Patent Application Publication (Translation of PCT Application) No. 2002-524818

Patent Literature 2: Japanese Unexamined Patent Application Publication No. 2011-129257

Patent Literature 3: Japanese Unexamined Patent Application Publication No. 2005-294128

SUMMARY OF INVENTION

Technical Problem

However, these Patent Literatures lack a viewpoint in which the scanning electron microscope is efficiently stably used for a long time. In other words, efficient adjustment and long-time stable operation are important to reliably provide substantial operation hours for the apparatus. Specifically, the viewpoint is a great importance to the scanning electron microscope, which is referred to as a critical dimension SEM (CDSEM) that measures the dimensions of fine patterns in semiconductor manufacture lines.

Specifically, in Patent Literature 1, time to two-dimensionally scan an electron beam on the selection slit is required, resulting in a reduction in time to use the electron microscope for its primary purpose. Frequent two-dimensional scanning on the selection slit is likely to be a cause of an unstable electron beam, which has to be avoided as much as possible.

Patent Literature 2 has no viewpoint of long-time stable operation of the apparatus. Fluctuations in the electric current applied to the slit are not taken into account as well.

Patent Literature 3 describes only a mechanical moving mechanism for adjusting the slit.

An object of the present invention is to provide an energy filter that solves the problems and stably implements a reduction in energy distribution.

Solution to Problem

In order to solve the problem, configurations described in claims are adopted, for example. The present invention includes a plurality of means for solving the problems. For one example, a configuration includes: an electron source that produces an electron beam; a trajectory dispersion unit that disperses a trajectory of an electron beam of electrons with a different energy value; a selection slit plate having a selection slit that selects an energy range of the dispersed electron beam; and a transmittance monitoring unit that monitors a transmittance of an electron beam, the electron beam being transmitted through the selection slit.

Advantageous Effects of Invention

According to the present invention, information about the position of the electron beam on the selection slit can be efficiently monitored. Accordingly, a reduction in energy distribution and a stable improvement of resolution can be achieved.

DESCRIPTION OF EMBODIMENTS

In the following, embodiments of the present invention will be described with reference to the drawings.

First Embodiment

Figure 1:
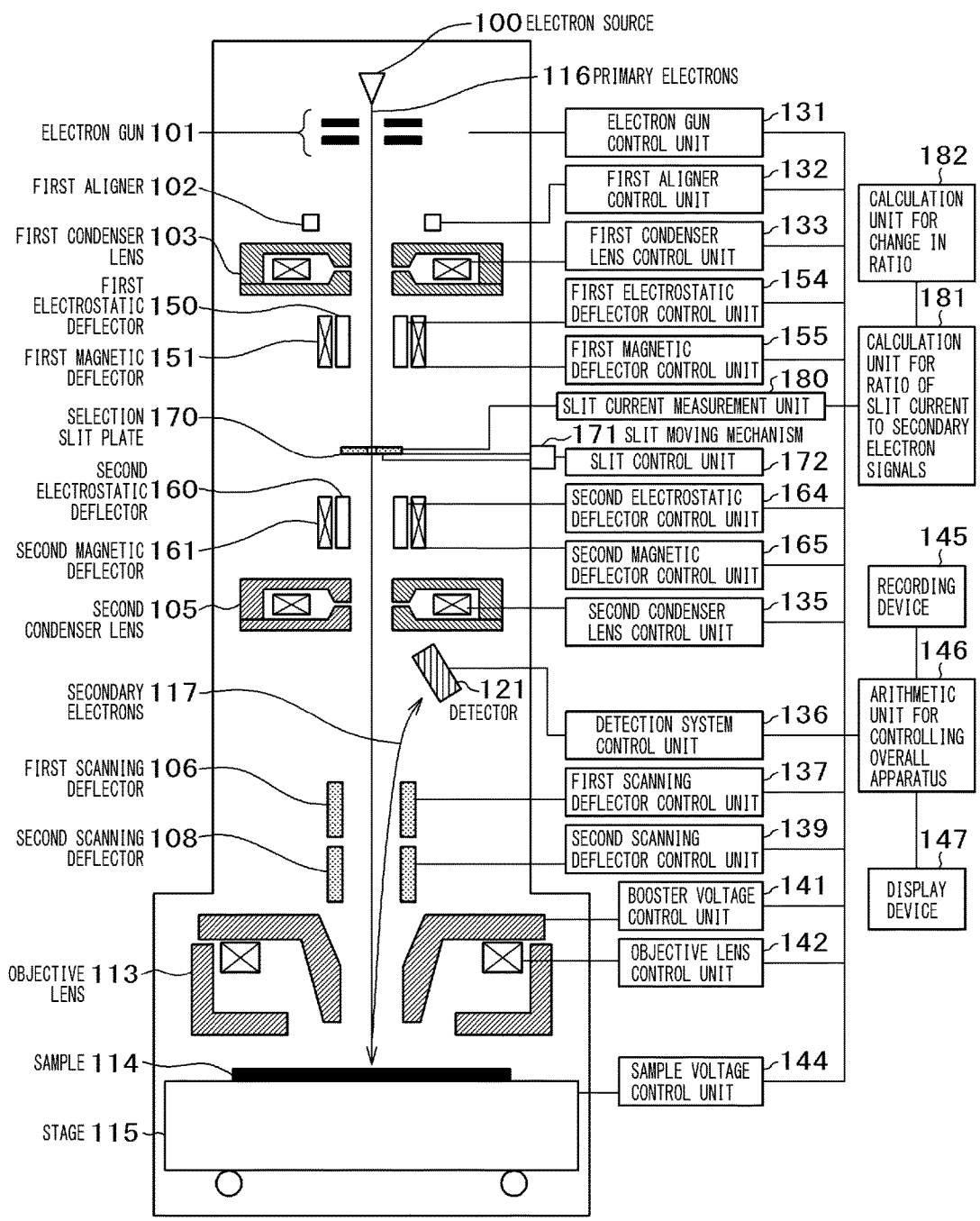
FIG. 1 is an overall schematic diagram of a scanning electron microscope according to a first embodiment.

FIG. 1 is an overall schematic diagram of a scanning electron microscope according to a first embodiment. In FIG. 1, primary electrons 116 are emitted from an electron source 100. The primary electrons 116 are passed through a first condenser lens 103, a first electrostatic deflector 150, a first magnetic deflector 151, a second electrostatic deflector 160, a second magnetic deflector 161, a second condenser lens 105, and an objective lens 113, and then focused on a sample 114 on a stage 115. A set of the first electrostatic deflector 150 and the first magnetic deflector 151 operates as a trajectory dispersion unit that disperses the trajectory of an electron beam of electrons with a different energy value. The second electrostatic deflector 160 and the second magnetic deflector 161 disposed as sandwiching the selection slit operate as optical elements that correct the dispersion of the trajectory. To the first and second electrostatic deflectors 150 and 160, a negative high voltage is applied in order to improve the efficiency of producing deflection chromatic aberration. Thus, the first and second electrostatic deflectors 150 and 160 exert the effect that the deflectors 150 and 160 operate as deceleration electrostatic lenses. A positive voltage is applied to a magnetic path on the objective lens 113, and a negative voltage is applied to the sample 114. An electrostatic lens is formed here. Thus, the objective lens 113 is a magnetic/electrostatic compound lens. The opening of the objective lens 113 is directed to the sample side in a lens structure referred to as a semi-in-lens type lens.

Secondary electrons 117 emitted from the sample 114 are detected at a detector 121 disposed in the middle part of the SEM, and a secondary electron signal is formed. In some cases, low-energy electrons are sorted into secondary electrons and high-energy electrons are sorted into reflection electrons. However, here, the notation is uniformly written into secondary electrons. Under the conditions in which the state of the sample is the same, the secondary electron signal correspond to an electric current amount transmitted through a selection slit 302, described later. The primary electrons on the sample are two-dimensionally scanned by a first scanning deflector 106 and a second scanning deflector 108. As a result, a two-dimensional image can be obtained. In the embodiment, the first and second scanning deflectors 106 and 108 are electrostatic deflectors. The two-dimensional image is displayed on a display device 147. Here, the set of the first electrostatic deflector 150 and the first magnetic deflector 151 and the set of the second electrostatic deflector 160 and the second magnetic deflector 161 are often referred to as "ExB" (E cross B).

Figure 2:
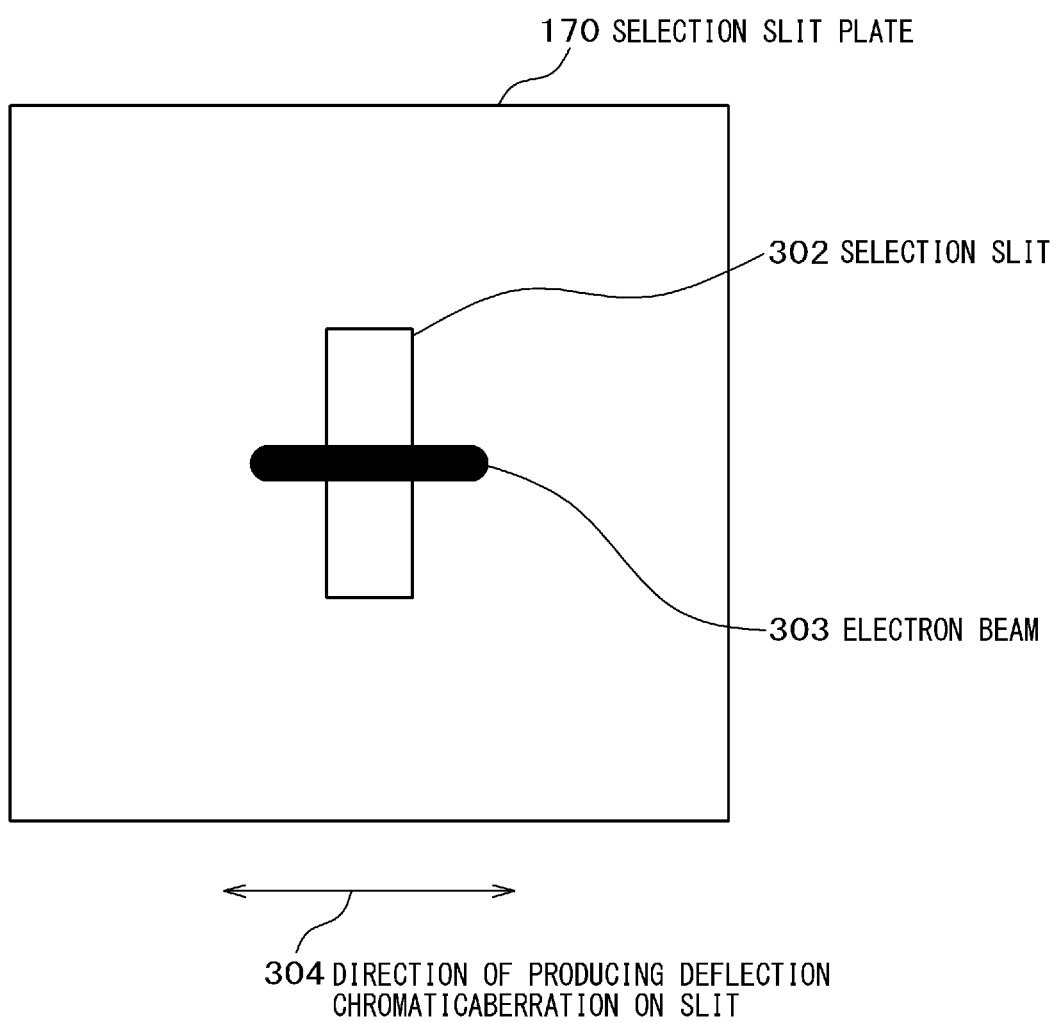
FIG. 2 is a diagram of the shape of an electron beam on a selection slit plate according to the first embodiment.

FIG. 2 is a diagram of the shape of an electron beam on a selection slit plate 170. The first electrostatic deflector 150 and the first magnetic deflector 151 are deflected in the direction orthogonal to the longitudinal direction of the selection slit 302 in the opposite direction (in the lateral direction in FIG. 2). Only deflection chromatic aberration is produced on the selection slit plate 170. Deflection chromatic aberration produces an oblong beam. Thus, an electron beam 303 is in an oblong beam shape. A part of the electron beam 303 is extracted at the selection slit 302, allowing energy distribution to be decreased. Commonly, an energy filter based on this principle is referred to as a Wien-filter.

As illustrated in FIG. 1, in the embodiment, a transmittance monitoring unit is provided, which is configured of a slit current measurement unit 180 e.g. an ammeter, a calculation unit 181 for the ratio of the slit current to the secondary electron signal e.g. a calculation circuit and software, and a calculation unit 182 for a variation of the ratio. The calculation unit 181 can also serve as the calculation circuit. The use of the transmittance monitoring unit allows the monitoring of the transmittance of the electron beam 303, which is being transmitted through the selection slit 302. Here, the transmittance may be defined as the ratio of the amount of the electron beam (the electric current amount) having collided with the selection slit plate 170 to the amount of the electron beam (the electric current amount) having been transmitted through the selection slit 302. Alternatively, the transmittance may be defined as the ratio of the sum of the amount of the electron beam having collided with the selection slit plate 170 and the amount of the electron beam having been transmitted through the selection slit 302 to the amount of the electron beam having been transmitted through the selection slit 302.

In the following, the necessity and importance of measuring the transmittance will be described.

First, the electric current amount of electrons emitted from the electron source commonly fluctuates. A field emission electron source has a large decrease in the initial electric current amount specifically. A Schottky electron source also has an increase and a decrease in the electric current amount, which are referred to as ripples. Thus, the electric current amount applied to the selection slit plate 170 is not always constant. On the other hand, the slit current and the strength of a secondary electron signal produced from the electrons having been transmitted through the selection slit 302, which is an electron signal having been transmitted through the selection slit 302, are determined from the electric current amount applied to the selection slit plate 170 and the slit transmittance of the electron beam 303. The slit transmittance most reflects the position of the electron beam on the selection slit plate 170. Thus, taking into the account of monitoring efficiency, merits are obtained by monitoring fluctuations in the position of the electron beam 303 only by the slit current or the strength of the secondary electron signal produced from the electrons having been transmitted through the selection slit 302. However, an error is to occur, which is resulted from the electric current amount applied to the selection slit plate 170. Thus, the ratio of the slit current to the strength of the secondary electron signal produced from the electrons having been transmitted through the selection slit 302 is determined, allowing a monitor value to be obtained, which substantially corresponds to the transmittance.

Fluctuations in the position of the electron beam 303 on the selection slit plate 170 affect the characteristics of the electron beam, which is being transmitted. The direct influence is a change in the electric current amount. This change is to affect the signal-to-noise ratio of the acquired image. In addition to this, an important change in the characteristics is a shift in the center of energy. This causes the focal position on the sample to be changed, changing the resolution of the electron beam on the sample. A further increase in fluctuations in the position finally causes the value of energy distribution to be changed, resulting in fluctuations in the resolution through chromatic aberration. These fluctuations in the resolution are unignorable as a factor of degrading the characteristics in the CDSEM that specifically has to measure pattern dimensions on acquired images with excellent reproducibility. Therefore, in order to stably operate the apparatus, it is important to set the transmittance that can sense correct fluctuations in the position of the electron beam to a monitor value.

In the embodiment, the slit current carried through the selection slit plate 170 and the strength of an electron signal transmitted through the selection slit 302 (the secondary electrons 117 corresponding to the amount of the transmission current) are measured for each of samples to be measured, and the ratio is set to the monitor value of the transmittance. In order to know a change in the ratio, the variation of the ratio is calculated. Note that, the variation of the ratio to be calculated may be the absolute value of a changing value, or may be the rate of change showing a relative change. The calculation units 181 and 182 can be integrated with each other. It is acceptable to share components between the calculation units 181 and 182.

Figure 3:
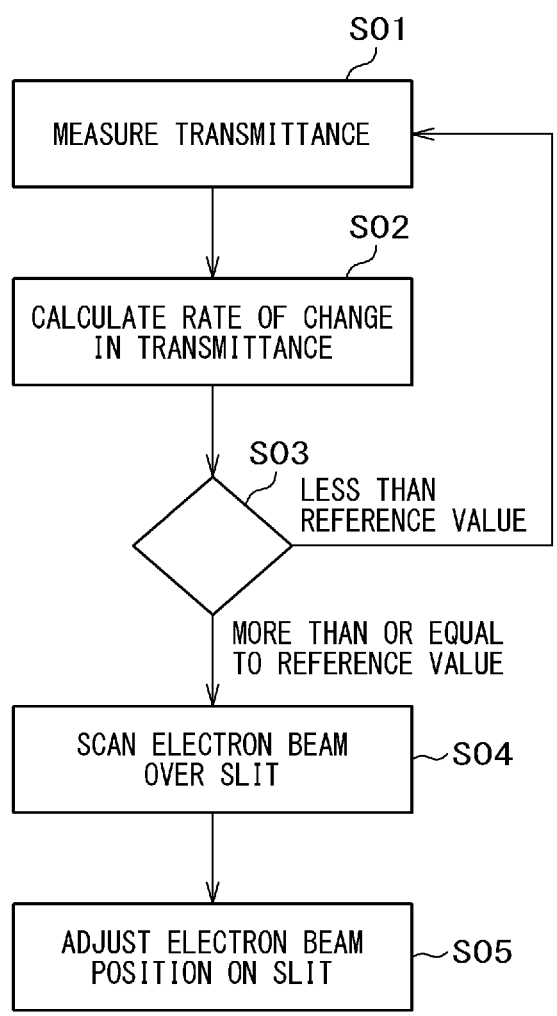
FIG. 3 is a flowchart of an adjustment process for the position of an electron beam on the selection slit plate according to the first embodiment.

FIG. 3 is a flowchart of an adjustment process for the position of an electron beam on the selection slit plate according to the embodiment. In FIG. 3, in Step S01, the monitor value corresponding to the transmittance is found, and the transmittance is measured. Subsequently, in Step S02, a change in the transmittance from the initial value is calculated. In Step S03, it is determined whether the value exceeds a reference value. In the case in which the value is the reference value or more, it is determined that the position of the electron beam is greatly shifted on the selection slit plate 170. In Step S04, the electron beam 303 is scanned over the selection slit plate 170. In Step S05, the position of the electron beam on the selection slit plate 170 is adjusted.

In other words, measuring the transmittance allows the relative position between the electron beam 303 and the selection slit 302 to be adjusted to a predetermined position, which is typically a position at which the center of the electron beam 303 is located in the center of the selection slit 302. Note that, for a specific process for adjusting the position, the deflector, such as the first electrostatic deflector 150, the first magnetic deflector 151, or the first aligner 102, as a deflection scanning unit that deflects and scans the electron beam 303 over the selection slit plate 170, or the slit moving mechanism 171 is used to adjust the relative position between the electron beam 303 and the selection slit 302.

Figure 4A:
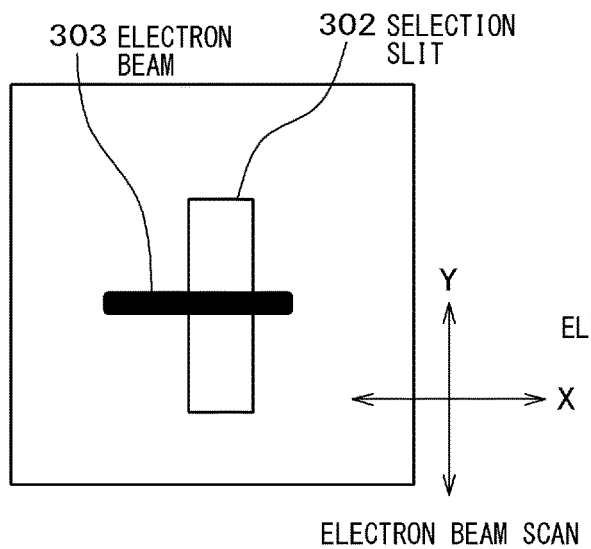
FIGS. 4A and 4B are diagrams of examples of signals obtained by scanning an electron beam over the selection slit plate according to the first embodiment.
Figure 4B:
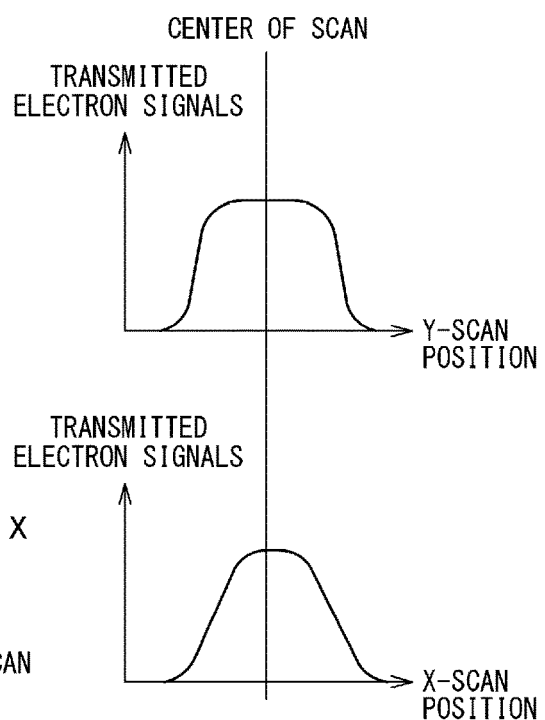

FIG. 4 is exemplary signals obtained by scanning an electron beam. (a) in FIG. 4 illustrates the positional relationship between the electron beam 303 and the selection slit 302, showing the case in which in the Y-direction, the centers are matched with each other, and in the X-direction, however, the center of the electron beam 303 is shifted to the left side. Under these conditions, (b) in FIG. 4 is profiles of transmitted electron signals (secondary electron signals) produced from electrons having been transmitted through the selection slit 302 in the case in which the electron beam 303 is scanned in the X- and Y-directions. In (b) in FIG. 4, the upper diagram is the profile of a transmitted electron signal for the position in the Y-direction scan. The lower diagram is the profile of a transmitted electron signal for the position in the X-direction scan. The shape of the selection slit 302 and the shape of the electron beam 303 are different from each other in the longitudinal direction. Thus, the profiles of the transmitted electron signals are different between the X-direction and the Y-direction. In other words, in the upper diagram of (b) in FIG. 4, in the case of the profile for the position in the Y-direction scan, the center of the electron beam 303 is matched with the center of the selection slit 302 in the Y-direction. Thus, the profile of the transmitted electron signal is in bilateral symmetry to the center of scan. On the other hand, in the lower diagram of (b) in FIG. 4, in the case of the profile for the position in the X-direction scan, the center of the electron beam 303 is shifted to the left side with respect to the center of the selection slit 302. For example, in order that the electron beam 303 is entirely moved to the right side of the selection slit 302 to make the transmitted electron signal to be zero, the scan distance is increased, resulting in a profile in which the center of the profile is shifted to the right with respect to the center of scan. In other words, the difference between the center of scan and the center of the profile is an amount to be adjusted.

In the Wien-filter used in the embodiment, the electron beam 303 is applied to the selection slit 302 with no deflection using two deflectors. Consequently, the use of the deflectors of the Wien-filter with a stable incident angle to the selection slit 302 provides merits in effective use of the embodiment, as the position of the electron beam can be scanned and adjusted.

Note that, in the embodiment, the transmittance was monitored for every wafer. Thus, the resolution of the electron beam on the sample can be controlled in a range of 1.5 nm±0.15 nm. The timing of monitoring the transmittance is not limited to every wafer. Wafers can also be monitored for every lot or every predetermined time period.

As described above, the embodiment is configured to include an electron source that produces an electron beam, a trajectory dispersion unit that disperses the trajectory of an electron beam of electrons with a different energy value, a selection slit plate having a selection slit that selects the energy range of the dispersed electron beam, and a transmittance monitoring unit that monitors the transmittance of an electron beam, which is being transmitted through the selection slit.

The trajectory dispersion unit is configured of a set of a magnetic deflector and an electrostatic deflector stacked on each other. Thus, the trajectory of an electron beam of electrons with a different energy value can be dispersed. A configuration is provided, in which a second set of a second magnetic deflector and a second electrostatic deflector stacked on each other is provided and the set and the second set are disposed as sandwiching the selection slit. Thus, these sets are operated as the optical elements that correct the dispersion of the trajectory.

The transmittance monitoring unit is configured to include a measurement unit for an electron signal transmitted through the selection slit, a measurement unit for a slit current carried through the selection slit plate, a calculation unit that calculates a ratio between the signals from these two measurement units, and a calculation unit that calculates a variation of the ratio.

In a configuration, a deflection scanning unit that deflects and scans an electron beam on the selection slit is provided. In the case in which a change in the transmittance exceeds a reference value, the electron beam is deflected and scanned over the selection slit using the deflection scanning unit. The deflection scanning unit is a deflector that deflects the electron beam or a slit moving mechanism that moves the selection slit plate.

Thus, information about the position of the electron beam on the selection slit can be efficiently monitored. As a result, a reduction in energy distribution and a stable improvement of resolution can be achieved.

Second Embodiment

Figure 5:
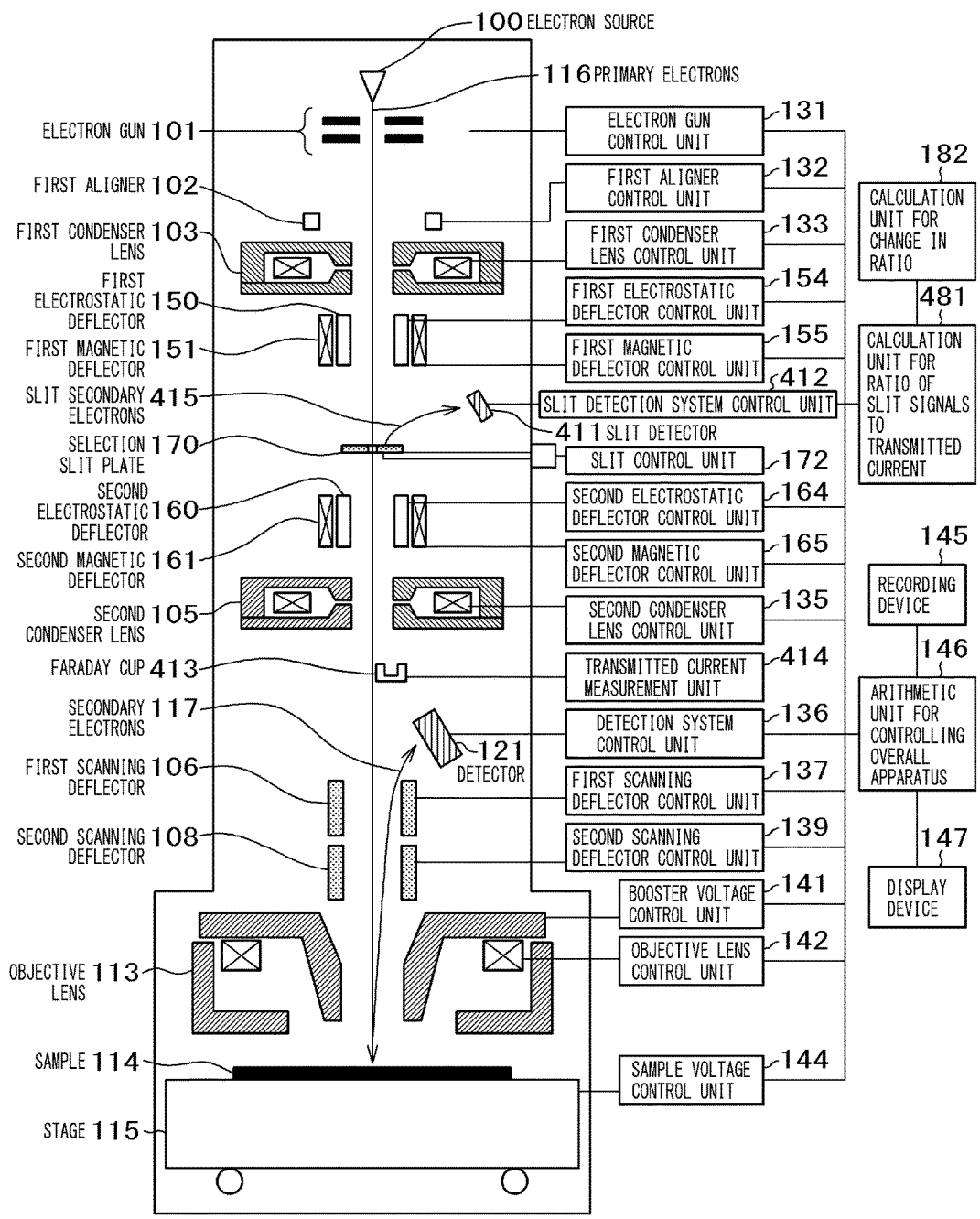
FIG. 5 is an overall schematic diagram of a scanning electron microscope according to a second embodiment.

FIG. 5 is an overall schematic diagram of a scanning electron microscope according to this embodiment. The embodiment is different from the first embodiment in that there are provided a slit detector 411 that detects slit secondary electrons 415 produced by applying the electron beam 303 to the selection slit plate 170, a slit detection system control unit 412 that controls the slit detector 411, a Faraday cup 413 that measures a transmitted electron beam current transmitted through the selection slit 302, a transmitted current measurement unit 414 that measures the electric current, and a calculation unit 481 for the ratio of the slit signal to the transmitted current that calculates a ratio of the slit signal expressing the signal strength of the slit secondary electrons detected at the slit detector 411 to the transmitted current measured at the transmitted current measurement unit 414. The other components are similar to those of the first embodiment FIG. 1, and the description is omitted.

In other words, the embodiment is different from the first embodiment in that in order to find the transmittance of the electron beam 303 transmitted through the selection slit 302 of the selection slit plate 170, instead of the slit current, a slit signal is used, which is the signal strength of the slit secondary electrons 415 produced by applying the electron beam 303 to the selection slit plate 170 and detected at the slit detector 411, i.e. an electron signal reflected off the selection slit plate, and instead of the secondary electrons 117, a transmitted electron beam current (a transmitted current) is used, which is transmitted through the selection slit and measured at the Faraday cup 413.

Thus, the monitor value of the transmittance in the embodiment is found in such a manner that the ratio of the electron signal reflected off the selection slit plate 170, which is the signal strength of the slit secondary electrons 415, to the transmitted current, which is the transmitted electron beam current transmitted through the selection slit 302, is calculated, and the monitor value is found from the variation of the ratio. In other words, these transmittance monitoring units can monitor the transmittance of the electron beam, which is being transmitted through the selection slit.

Note that, in the measurement of the current value at the Faraday cup, the trajectory of the electron beam after transmitted through the selection slit is controlled by the deflectors.

Merits according to the embodiment are that insulation processing and interconnections for measuring the slit current are unnecessary, and that the transmitted electron beam current transmitted through the selection slit and measured at the Faraday cup is accurate and highly reliable although the secondary electrons are affected by the surface state of the sample.

Note that, the transmittance can also be monitored using the combination of the transmitted electron signal (the signal amount of the secondary electrons 117) used in the first embodiment and the slit signal (the slit secondary electrons 415). The transmittance may be monitored using the combination of the slit current used in the first embodiment and the transmitted current (the transmitted electron beam current transmitted through the selection slit and measured at the Faraday cup).

Note that, in the embodiment, the transmittance was monitored for every lot. Thus, the resolution of the electron beam on the sample can be controlled in a range of 1.5 nm±0.25 nm.

As described above, the embodiment is configured to include an electron source that produces an electron beam, a trajectory dispersion unit that disperses the trajectory of an electron beam of electrons with a different energy value, a selection slit plate having a selection slit that selects the energy range of the dispersed electron beam, and a transmittance monitoring unit that monitors the transmittance of an electron beam, which is being transmitted through the selection slit. The transmittance monitoring unit includes a measurement unit for the amount of a transmission current, a measurement unit for an electron signal reflected off the selection slit plate, a calculation unit that calculates a ratio between the signals from these two measurement units, and a calculation unit that calculates a variation of the ratio.

Thus, in the embodiment, information about the position of the electron beam on the selection slit can be efficiently monitored. As a result, a reduction in energy distribution and a stable improvement of resolution can be achieved.

Third Embodiment

Figure 6:
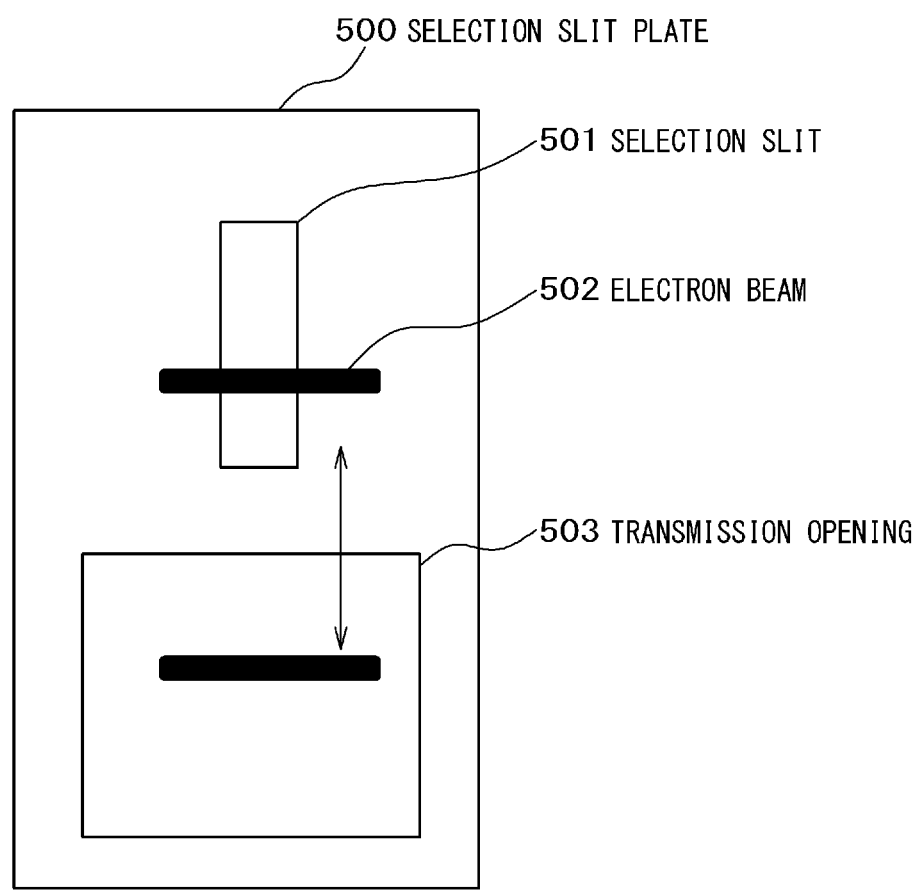
FIG. 6 is a diagram of a selection slit plate and an electron beam according to a third embodiment.

This embodiment shows an example in which the transmittance of the electron beam transmitted through the selection slit of the selection slit plate is directly found. FIG. 6 is a diagram of a selection slit plate and an electron beam used in the embodiment. The overall structure of the other components is similar to that of the first or second embodiment.

In FIG. 6, a selection slit plate 500 has a large-sized opening (a transmission opening 503), through which the entire electron beam can be substantially transmitted, near a selection slit 501 for a reduction in energy distribution. In the embodiment, an electron beam 502 is electrically moved across two openings (the selection slit 501 and the transmission opening 503) for measuring two transmitted electron signals or two transmitted currents. From the ratio between these two values, the transmittance of the electron beam is found as the ratio of the electron beam, which is being transmitted through the selection slit 501, to the entire electron beam produced from the electron source, obtaining a monitor value. In other words, these transmittance monitoring units allow the transmittance of the electron beam to be monitored, which is being transmitted through the selection slit 501. Merits according to the embodiment are that the measurement of the slit current or the slit secondary electrons is unnecessary to measure the transmittance, and that the transmittance can be found as an absolute value.

As described above, the embodiment is configured to include a selection slit plate and a transmittance monitoring unit. The selection slit plate has a transmission opening near the selection slit, the transmission opening through which the electron beam is entirely transmitted. The transmittance monitoring unit includes a measurement unit that measures a first measured value of a transmitted electron signal or a transmitted current transmitted through the selection slit and a second measured value of a transmitted electron signal or a transmitted current transmitted through the transmission opening, a calculation unit that calculates a ratio of the first measured value to the second measured value, and a calculation unit that calculates a variation of the ratio.

Thus, in the embodiment, information about the position of the electron beam on the selection slit can be efficiently monitored. As a result, effects are exerted in which a reduction in energy distribution and a stable improvement of resolution can be achieved. In addition to these effects, effects are exerted in which the measurement of the slit current or the slit secondary electrons is unnecessary to measure the transmittance and the transmittance can be found as an absolute value.

Fourth Embodiment

In this embodiment, an example will be described in which the signal strength of the slit secondary electrons is used to provide criteria to determine the timing of monitoring the transmittance of an electron beam.

In other words, the slit secondary electron signal can be measured all the time, and time used for the primary purpose is not decreased. From the monitoring of a change in the signals, the detection of some abnormality can be expected. However, as described earlier, because of fluctuations in the applied electron beam, this is imperfect as the monitoring of the position of the electron beam on the selection slit plate. Thus, in the embodiment, in the case in which a change in the signal strength of the slit secondary electrons exceeds a reference value, the transmittance is measured, and it is determined whether it is necessary to adjust the position of the electron beam.

Figure 7:
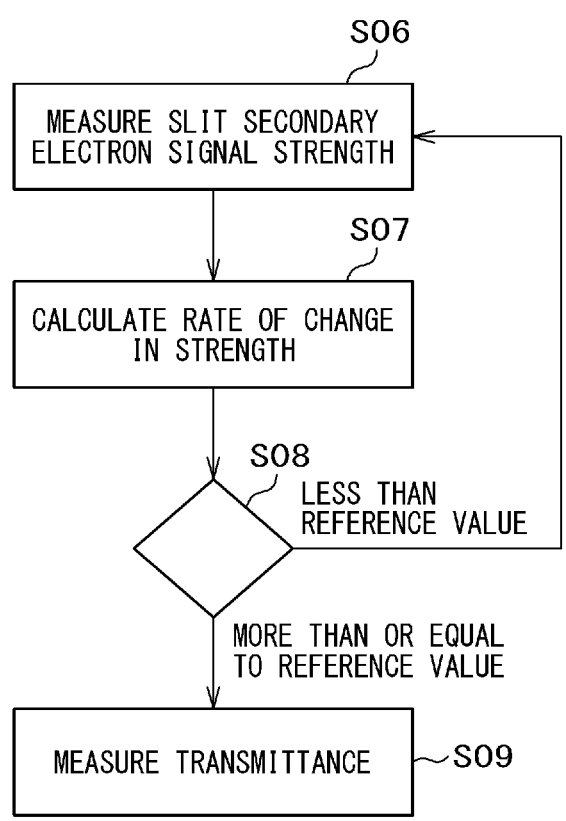
FIG. 7 is a flowchart of the timing of measuring the transmittance using the signal strength of slit secondary electrons according to a fourth embodiment.

FIG. 7 is a flowchart of the timing of measuring the transmittance using the signal strength of slit secondary electrons. In FIG. 7, in Step S06, the signal strength of the slit secondary electrons is measured. In the specific configuration, the slit detector 411 in FIG. 5 detects the signal strength. In Step S07, the rate of change in the signal strength is calculated. In Step S08, it is determined whether the value exceeds a reference value. In the case in which the value is the reference value or more, the transmittance is measured in Step S09. Note that, here, the variation of a change in the signal strength is described as the rate of change showing a relative change. However, it may be the absolute value of a changing value.

As described above, in the embodiment, for the criteria to determine the timing of monitoring the transmittance of an electron beam, the description is made in which the strength of the slit secondary electron signal is used. This concept is also applicable to other signals (the slit current, the transmitted electron signal, and the transmitted current). It is also effective in monitoring the transmittance for every wafer or lot in parallel with this timing.

Note that, the combination of the embodiment and monitoring the transmittance for every lot allows control over the resolution of the electron beam on the sample in a range of 1.5 nm±0.15 nm.

As described above, the embodiment is configured as follows. A transmitted electron signal or the transmitted current transmitted through the selection slit, or an electron signal reflected off the selection slit plate, or a slit current carried through the selection slit plate is measured. In the case in which the variation of the measured value exceeds a reference value, the transmittance monitoring unit measures the transmittance of the electron beam on the selection slit. Accordingly, the timing of monitoring the transmittance of the electron beam can be determined.

Fifth Embodiment

In this embodiment, an example will be described in which it is determined whether to adjust the position of the electron beam on the selection slit plate and it is determined to select a specific process for adjusting the position.

Figure 8:
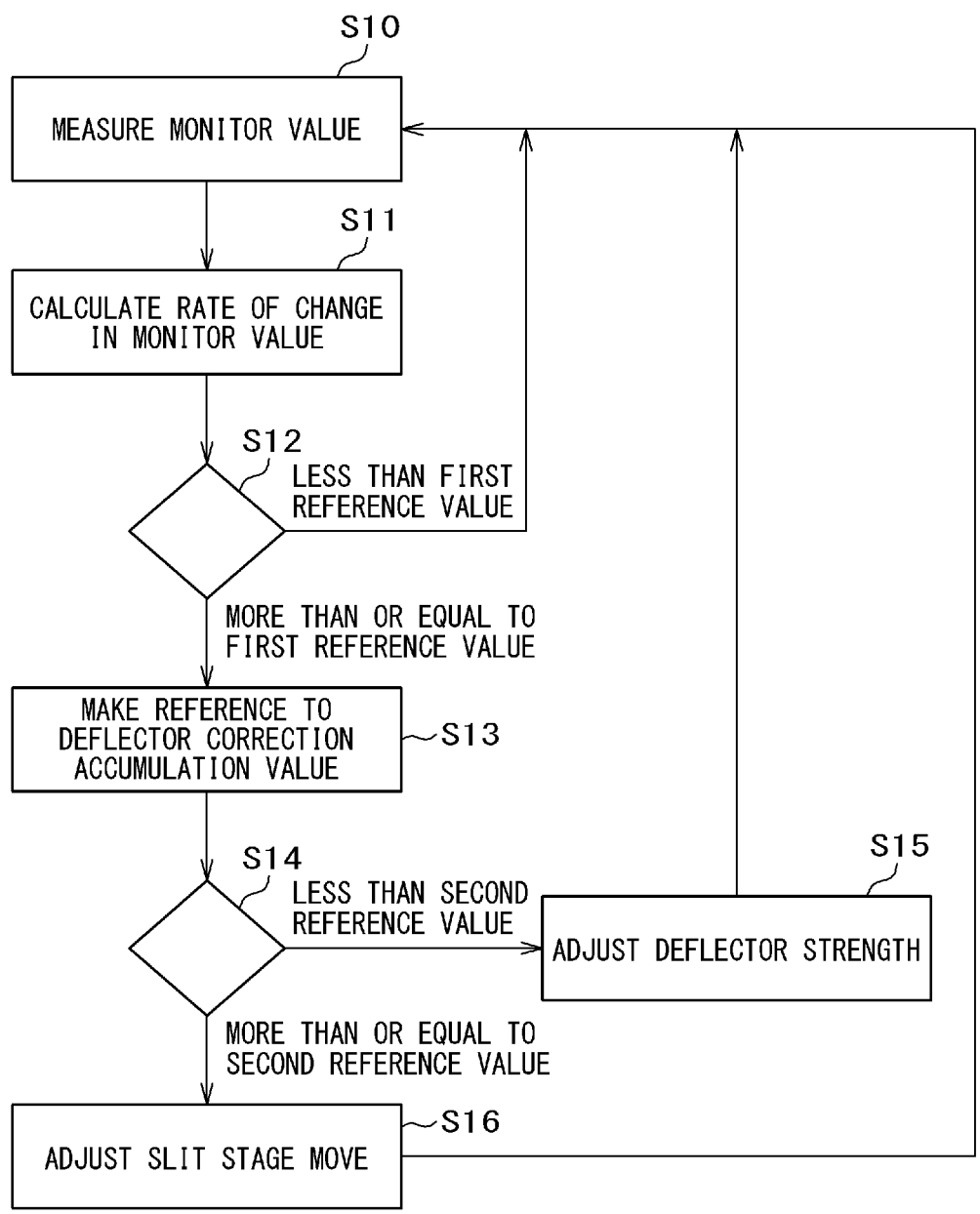
FIG. 8 is a flowchart of an adjustment process for the position of an electron beam on a selection slit plate according to a fifth embodiment.

FIG. 8 is a process flow according to the embodiment. The overall structure according to the embodiment is the same as that in FIG. 1 or 5. However, FIG. 8 is different from FIG. 3 in that a plurality of reference values is provided in the process flow.

In FIG. 8, in Steps S10, S11, and S12, the transmittance is monitored, and it is determined whether a change is less than a first reference value. These processes are similar to those in Steps S01, S02, and S03 in FIG. 3. In the case in which the change is the first reference value or more, it is determined that the position of the electron beam is greatly shifted on the selection slit plate, and the process goes to the adjustment of the position of the electron beam.

Here, as described in the first embodiment, the position is adjusted by deflecting and scanning the electron beam over the selection slit plate using the deflection scanning unit. For specific methods, there are methods, in which the position of the beam on the slit is adjusted by correction using the deflector, such as the first electrostatic deflector 150, the first magnetic deflector 151, or the first aligner 102, and in which the relative position of the electron beam is adjusted by driving a mechanical slit stage, not shown, using the slit moving mechanism 171. In the adjustment using the deflector, an increase in the accumulation value for correction using the deflector increases a displacement in the trajectory of the electron beam. In the mechanical control of the position by driving the slit stage, the position resolution is not so great as that in the electrical control over the position of the electron beam. However, the beam can be greatly moved. The importance is to properly use these methods.

Thus, in Step S13, reference is made to an accumulation value of deflector correction. In Step S14, it is determined whether the value is a second reference value or more. In the case in which the value is the second reference value or less, in Step S15, the deflector adjusts the strength for the deflection amount, adjusting the position of the beam on the slit. On the other hand, in the case in which the value is the second reference value or more, in Step S16, the selection slit plate is moved for adjustment by driving the slit stage because of a large displacement in the trajectory of the electron beam, adjusting the relative position of the electron beam.

Note that, in the case of driving the slit stage, desirably, deflector control is returned to the initial state with the combined use of adjusting the optical axis of the electron beam as well.

As described above, the embodiment is configured as follows. In deflecting and scanning the electron beam on the selection slit plate, it is determined whether an accumulation value for correcting the electron beam using the deflector is the second reference value or more. In the case in which the accumulation value is less than the second reference value, the position of the electron beam is adjusted using the deflector. In the case in which the accumulation value is the second reference value or more, the position of the selection slit is adjusted using the slit moving mechanism. Thus, in the adjustment of the position of the electron beam on the selection slit plate, adjustment is possible, taking into account both of accuracy obtained from position resolution and the speed of adjusting the position.

Sixth Embodiment

In this embodiment, focus correction will be described.

As described above, moving the electron beam on the selection slit plate shifts the center value of the energy of the electron beam. This causes the focal position of the electron beam on the sample surface to be changed, causing fluctuations in the resolution. In general-purpose SEMs, the focus is manually corrected all the time, which substantially reduces visible fluctuations. However, like the critical dimension SEM, which is a device that is desired to avoid operations other than image acquisition as much as possible, it is preferable to reduce the number of times to correct the focus as much as possible. Therefore, in the embodiment, the transmittance is monitored, and the focus is corrected in the case in which a change in the value is the reference value or more. Note that, the overall structure of the scanning electron microscope according to the embodiment is similar to that of the first or second embodiment.

Figure 9:
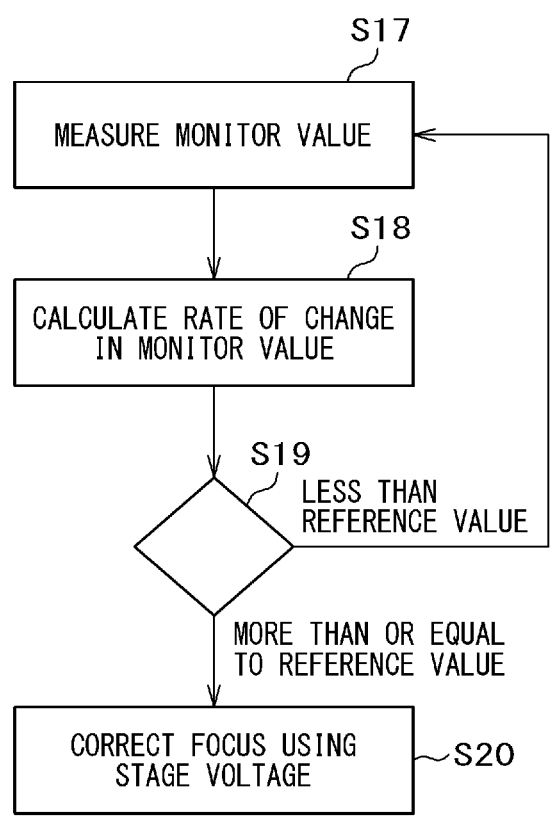
FIG. 9 is a flowchart of a process for focus correction according to a sixth embodiment.

FIG. 9 is a flowchart according to the embodiment. In FIG. 9, in Steps S17, S18, and S19, the transmittance is monitored, and it is determined whether a change is less than the reference value. Note that, in Step S18, the variation of a change in the monitor value is described as the rate of change showing a relative change. However, it may be the absolute value of a changing value. Similarly to the first or second embodiment, the monitor value of the transmittance is the electron signal or the transmitted current transmitted through the selection slit or the electron signal reflected off the selection slit plate or the slit current carried through the selection slit plate.

In the case in which the monitor value exceeds the reference value, in Step S20, the focus is corrected. With this configuration, fluctuations in the resolution can be reduced at a fewer number of times to correct the focus.

Note that, the reference value for focus correction is smaller than the first reference value for determining whether to adjust the position of the electron beam in the fifth embodiment. The focus may be corrected by changing the electric current of an objective electromagnetic coil, which is commonly performed. However, here, the focus is corrected by changing the stage voltage. The cause of a change in the focal point is a change in the energy of the electron beam, changing the stage voltage in order to constantly maintain energy applied to the sample.

Note that, with the combination of the embodiment and monitoring the transmittance for every thirty minutes, the resolution of the electron beam on the sample can be controlled in a range of 1.5 nm±0.1 nm.

As described above, the embodiment is configured to include an electron source that produces an electron beam, a trajectory dispersion unit that disperses the trajectory of an electron beam of electrons with a different energy value, a selection slit plate having a selection slit that selects the energy range of the dispersed electron beam, an objective lens that applies the electron beam to the sample, a stage on which the sample is placed, and a transmittance monitoring unit that monitors an electron signal or a transmitted current transmitted through the selection slit or an electron signal reflected off the selection slit plate or a slit current carried through the selection slit plate. In the case in which the variation of the monitor value is greater than a reference value, the focus is corrected on the sample. Thus, fluctuations in the resolution can be reduced by a fewer number of times to correct the focus.

Seventh Embodiment

In this embodiment, the shape of an electron beam will be described.

Figure 10:
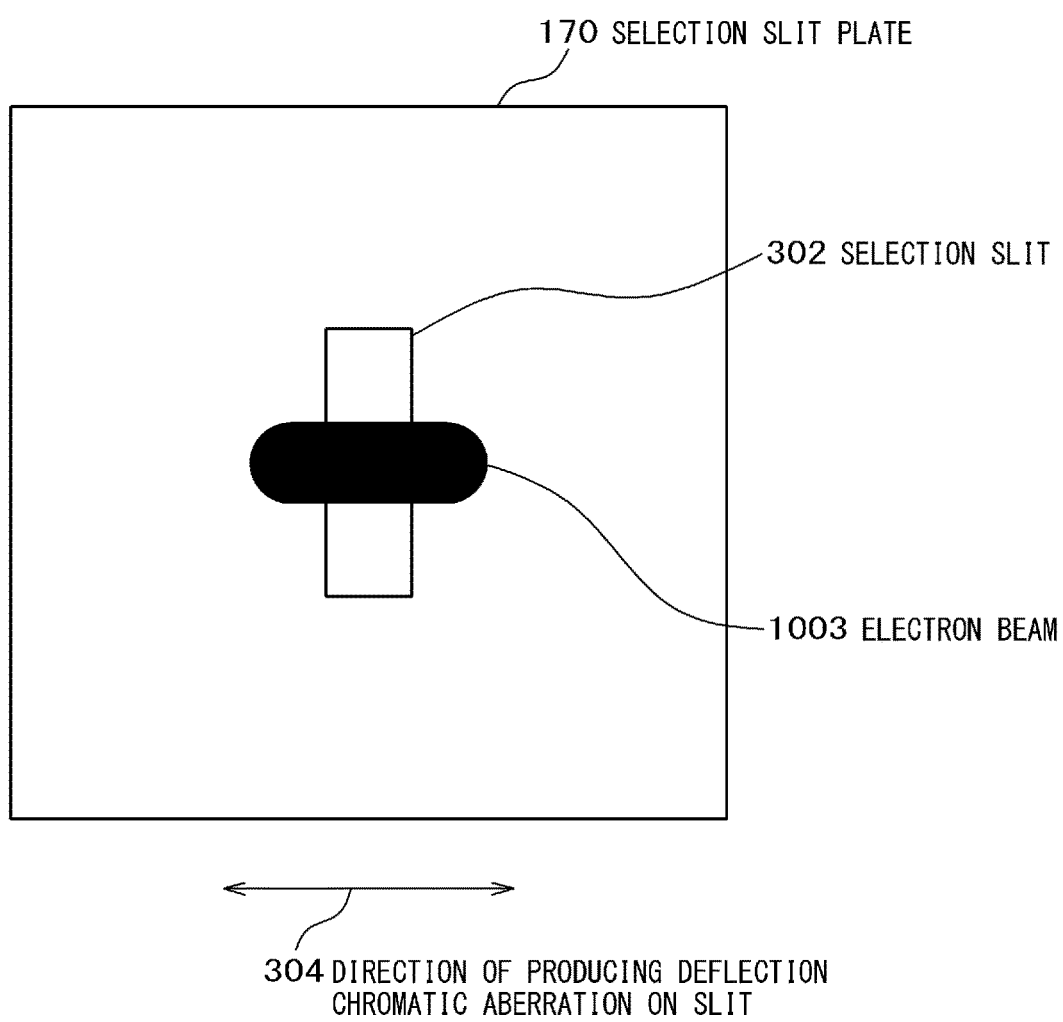
FIG. 10 is a diagram of the shape of an electron beam on a selection slit plate according to a seventh embodiment.

FIG. 10 is a diagram of the shape of an electron beam on the selection slit plate according to the embodiment. In FIG. 10, the shape of an electron beam 1003 is wider in the longitudinal direction of the selection slit 302, compared with the shape in FIG. 2.

Figure 11:
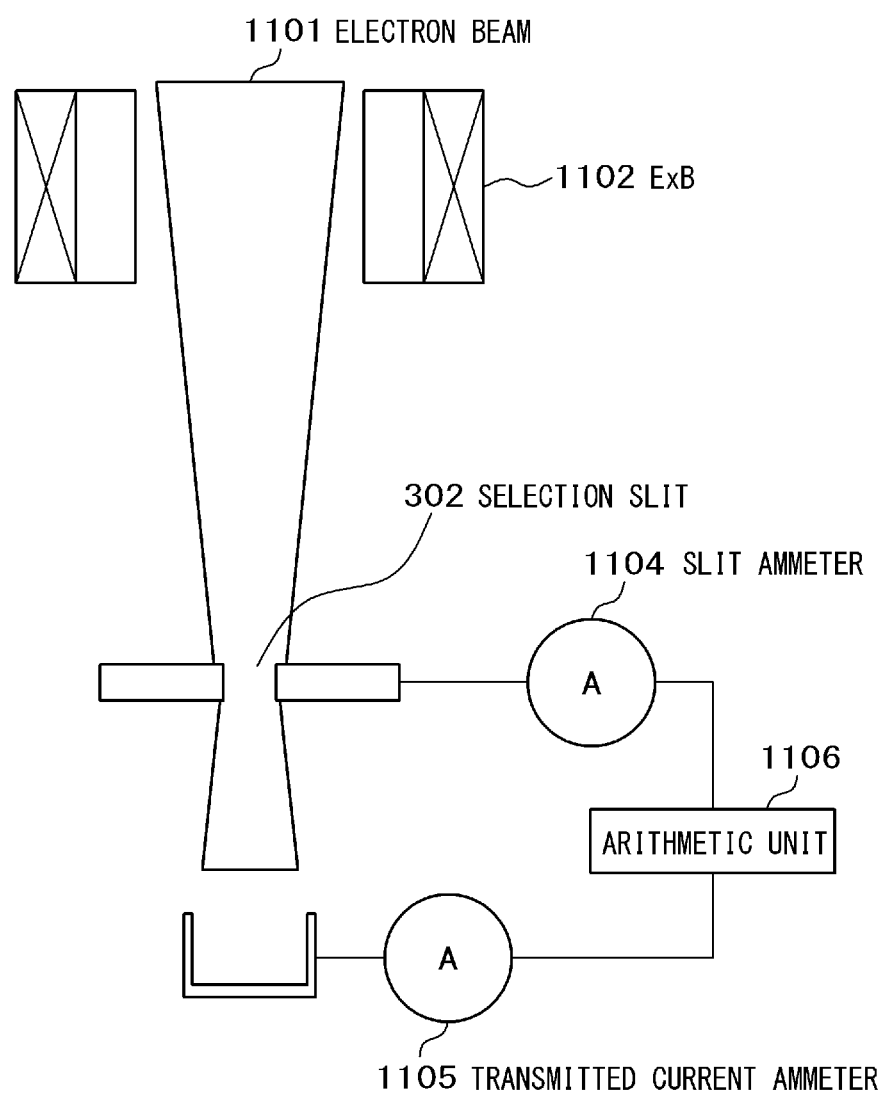
FIG. 11 is a diagram of the trajectory of an electron beam according to the seventh embodiment.

Commonly, as illustrated in FIG. 11, an electron beam 1101 (the electron beam 1003 in FIG. 10) applied to the selection slit 302 is brought into focus on the slit. This is because the selectivity of energy distribution is enhanced using the selection slit 302. However, the focus is not necessarily achieved in the longitudinal direction of the selection slit 302 with enhanced selectivity. As illustrated in FIG. 11, in the embodiment, the ratio of a slit current value measured at a slit ammeter 1104 to a transmitted current value measured at a transmission current ammeter 1105 is calculated at an arithmetic unit 1106 to monitor the transmittance of the electron beam 1101. In the case of forming a slit in a micro size as the order of micrometers or less, limit is imposed on the length of the selection slit 302 in the longitudinal direction. This also causes the necessity to pay attention to a change in the position of the electron beam in the longitudinal direction of the selection slit 302. In paying this attention, in the shape of the electron beam with a small width in the longitudinal direction of the selection slit 302 as illustrated in FIG. 2, in the case in which the electron beam 303 reaches the end of the selection slit 302 in the longitudinal direction, the transmitted current is suddenly decreased. This causes the detection of an abnormality to be delayed in monitoring the transmittance.

Therefore, in order to decrease the sensitivity to fluctuations in the position of the electron beam 1003 in the longitudinal direction of the selection slit 302, desirably, the electron beam 1003 is widened in the longitudinal direction of the selection slit 302, i.e. in the direction nearly perpendicular to the dispersing direction of the trajectory of the electron beam 1003 more than the case in which the focus is achieved, and then the electron beam 1003 is applied to the selection slit plate 170.

For a specific implementation method, an effective method is a method in which the focus state on the selection slit plate 170 is turned to a defocus state, or in which with the combination of astigmatic aberration and defocusing, the electron beam 1003 is widened only in the longitudinal direction of the selection slit 302.

Eighth Embodiment

In this embodiment, an exemplary monitor screen will be described.

Figures 12, 13:
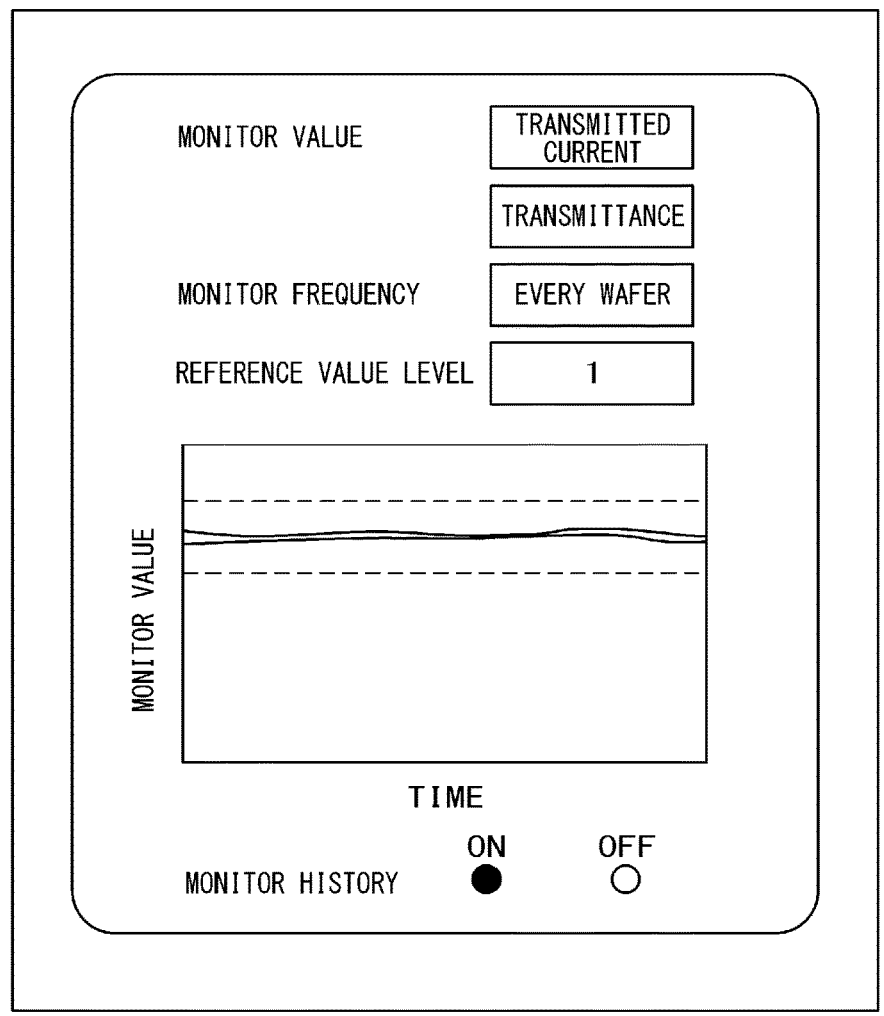
FIG. 12 is a diagram of a monitor screen according to an eighth embodiment.
FIG. 13 is a diagram of a set value table for reference values in separate modes according to a ninth embodiment.

FIG. 12 is a diagram of a monitor screen according to the embodiment. In FIG. 12, monitor values, monitor frequency, and the selected result of reference value level are displayed on the screen. A graph of a change in the monitor value in the past is also displayed. An ON indicator and an OFF indicator for monitor history are also provided. With reference to these, a monitoring method suited to the apparatus state can be selected.

Ninth Embodiment

In this embodiment, setting the reference values will be described.

The reference values used in the foregoing embodiments are changed depending on resolution or throughput, for example, required for the apparatus. Thus, it is necessary to appropriately set the reference values. These values may be set in advance, or may be set on each occasion while actual measurement is being performed. In the case in which the reference values are set in advance, for example, the reference values are recorded in a form of a table in advance on a recording device 145 in FIG. 1, and reference is made to the table in setting the reference values.

FIG. 13 is a set value table for individual modes in the case of reference values for the rate of change in the transmittance for adjusting the position of the electron beam on the selection slit plate. In FIG. 13, for example, in high resolution mode 1, the reference value is set to small, and control is finely performed. In high speed mode 2, priority is given to throughput with coarse adjustment, and the reference value is large in this mode. In high electric current mode 3, a high electric current is carried in order to hold signal strength, and the reference value is middle in this mode. In high-depth-of-focus mode 4, the reference value is also middle in this mode.

As described above, the embodiments are described. However, the present invention is not limited to the above-described embodiments, and various exemplary modifications are included. For example, in the embodiments, only the embodiments using the Wien-filter are described. However, the embodiments are also effective for energy filters in other methods, such as an Ω-filter and a gamma filter. A part of the configuration of an embodiment can be replaced with the configuration of another embodiment. The configuration of an embodiment can be added with the configuration of another embodiment. A part of the configuration of the embodiments can be added with, removed from, or replaced with the other configurations.

LIST OF REFERENCE SIGNS

100: Electron source
101: Electron gun
102: First aligner
103: First condenser lens
105: Second condenser lens
106: First scanning deflector
108: Second scanning deflector
113: Objective lens
114: Sample
115: Stage
116: Primary electrons
117: Secondary electrons
121: Detector
131: Electron gun control unit
132: First aligner control unit
133: First condenser lens control unit
135: Second condenser lens control unit
136: Detection system control unit
137: First scanning deflector control unit
139: Second scanning deflector control unit
141: Booster voltage control unit
142: Objective lens control unit
144: Sample voltage control unit
145: Recording device
146: Arithmetic unit for controlling the entire apparatus
147: Display device
150: First electrostatic deflector
151: First magnetic deflector
160: Second electrostatic deflector
161: Second magnetic deflector
170: Selection slit plate
171: Slit moving mechanism
172: Slit control unit
180: Slit current measurement unit
181: Calculation unit for a ratio of a slit current to a secondary electron signal
182: Calculation unit for a change in the ratio
302: Selection slit
303: Electron beam
304: Direction of producing deflection chromatic aberration on the slit
411: Slit detector
412: Slit detection system control unit
413: Faraday cup
414: Transmitted current measurement unit
415: Slit secondary electrons
500: Selection slit plate
501: Selection slit
502: Electron beam
503: Transmission opening
481: Calculation unit for a ratio of a slit signal to a transmitted current
701: Selection slit
702: Electron beam
1001: Selection slit plate
1002: Selection slit
1003: Electron beam
1004: Direction of producing deflection chromatic aberration on the slit
1101: Electron beam
1102: ExB
1103: Selection slit
1104: Slit ammeter
1105: Transmission current ammeter
1106: Arithmetic unit

The invention claimed is:

1. A scanning electron microscope comprising:
an electron source that produces an electron beam;
a trajectory dispersion unit that disperses a trajectory of the electron beam, which includes electrons with different energy values;
a selection slit plate having a selection slit that selects an energy range of the dispersed electron beam;
a deflection scanning unit that deflects and scans the electron beam over the selection slit plate; and
a transmittance monitoring unit that monitors a transmittance of the electron beam, the electron beam being transmitted through the selection slit;
wherein the trajectory dispersion unit is configured of a set of a magnetic deflector and an electrostatic deflector stacked on each other;
wherein, based on the electron beam, the transmittance monitoring unit measures one of a first electron signal transmitted through the selection slit, a transmitted current transmitted through the selection slit, a second electron signal reflected off the selection slit plate, and a slit current carried through the selection slit plate to obtain a measured value;
wherein, when a variation of the measured value exceeds a reference value, the transmittance monitoring unit measures the transmittance of the electron beam at the selection slit; and wherein the transmittance monitoring unit determines a variation of the transmittance, and when the transmittance monitoring unit determines that the variation of the transmittance exceeds a reference value, the deflection scanning unit deflects and scans the electron beam over the selection slit.

2. The scanning electron microscope according to claim 1, further comprising:
a second set of a second magnetic deflector and a second electrostatic deflector stacked on each other is provided,
wherein the set and the second set are disposed as sandwiching the selection slit.

3. The scanning electron microscope according to claim 1, wherein the transmittance monitoring unit includes
a first measurement unit that measures the first electron signal or the transmitted current transmitted through the selection slit and outputs a first measured signal,
a second measurement unit that measures the second electron signal reflected off the selection slit plate or the slit current carried through the selection slit plate and outputs a second measured signal,
a first calculation circuit programmed to calculate a ratio between the first and second measured signals from the first and second measurement units, and
a second calculation circuit programmed to calculate a variation of the ratio.

4. The scanning electron microscope according to claim 1, wherein the selection slit plate has a transmission opening near the selection slit, the transmission opening being larger than a width of the electron beam; and
the transmittance monitoring unit includes
a measurement unit that measures the measured value as a first measured value of the first electron signal or the transmitted current transmitted through the selection slit and a second measured value of the second electron signal or the slit current transmitted through the transmission opening,
a first calculation circuit programmed to calculate a ratio of the first measured value to the second measured value, and
a second calculation circuit programmed to calculate a variation of the ratio.

5. The scanning electron microscope according to claim 1, wherein the deflection scanning unit is a deflector that deflects the electron beam or a slit moving mechanism that moves the selection slit plate.

6. The scanning electron microscope according to claim 1, wherein the trajectory dispersion unit controls a width of the electron beam in a longitudinal direction of the selection slit so that the width of the electron beam is wider than when the electron beam is focused on the selection slit.

7. A scanning electron microscope comprising:
an electron source that produces an electron beam;
a trajectory dispersion unit that disperses a trajectory of the electron beam of electrons with a different energy value;
a selection slit plate having a selection slit that selects an energy range of the dispersed electron beam;
a transmittance monitoring unit that monitors a transmittance of the electron beam, the electron beam being transmitted through the selection slit; and
a deflection scanning unit that deflects and scans the electron beam over the selection slit plate;
wherein the transmittance monitoring unit determines a variation of the transmittance, and when the transmittance monitoring unit determines that the variation of the transmittance exceeds a reference value, the deflection scanning unit deflects and scans the electron beam over the selection slit;
wherein the deflection scanning unit is a deflector that deflects the electron beam or a slit moving mechanism that moves the selection slit plate;
wherein: in the deflection and scanning, the transmittance monitoring unit determines whether an accumulation value for correcting the electron beam using the deflector is a second reference value or more;
when the accumulation value is less than the second reference value, the deflector adjusts a position of the electron beam; and
when the accumulation value is the second reference value or more, the slit moving mechanism adjusts a position of the selection slit.

8. A scanning electron microscope comprising:
an electron source that produces an electron beam;
a trajectory dispersion unit that disperses a trajectory of the electron beam, which includes electrons with different energy values;
a selection slit plate having a selection slit that selects an energy range of the dispersed electron beam;
an objective lens that applies the electron beam to a sample;
a stage on which the sample is placed; and
a transmittance monitoring unit that monitors an electron signal or a transmitted current transmitted through the selection slit or an electron signal reflected off the selection slit plate or a slit current carried through the selection slit plate to obtain a measured value,
wherein, when a variation of the measured value is greater than a reference value, a focus on the sample is corrected by changing a voltage applied to the stage of the scanning electron microscope; and
wherein the trajectory dispersion unit is configured of a set of a magnetic deflector and an electrostatic deflector stacked on each other.

* * * * *